(12) United States Patent
Koo et al.

(10) Patent No.: US 7,982,398 B2
(45) Date of Patent: Jul. 19, 2011

(54) BACKLIGHT UNIT AND LIQUID CRYSTAL DISPLAY DEVICE INCLUDING THE SAME

(75) Inventors: Young-Mo Koo, Suwon-si (KR); Doo-Hwan Kim, Suwon-si (KR); Hyuk-Sang Jun, Suwon-si (KR); Tae-Shick Kim, Suwon-si (KR); Hye-In Jeong, Suwon-si (KR); Ok-Keun Song, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 280 days.

(21) Appl. No.: 11/732,767

(22) Filed: Apr. 4, 2007

(65) Prior Publication Data
US 2007/0278951 A1    Dec. 6, 2007

(30) Foreign Application Priority Data

Jun. 5, 2006  (KR) .................. 10-2006-0050472

(51) Int. Cl.
*H01J 1/62* (2006.01)
(52) U.S. Cl. .................................................. 313/512
(58) Field of Classification Search .......... 313/495–512; 315/169.1, 169.3, 169.4; 428/690–691, 917; 438/26–29, 34, 82; 257/40, 72, 79, 98–100, 257/642–643, 759
See application file for complete search history.

(56) References Cited

U.S. PATENT DOCUMENTS

| | | | |
|---|---|---|---|
| 2002/0033908 A1 | 3/2002 | Mori et al. | |
| 2005/0174046 A1* | 8/2005 | Hasegawa et al. | 313/504 |
| 2006/0043406 A1* | 3/2006 | Tsubokura et al. | 257/99 |
| 2006/0186802 A1* | 8/2006 | Cok et al. | 313/506 |
| 2007/0063641 A1* | 3/2007 | Cok et al. | 313/506 |
| 2007/0077349 A1* | 4/2007 | Newman et al. | 427/66 |
| 2007/0103056 A1* | 5/2007 | Cok | 313/503 |
| 2007/0114925 A1* | 5/2007 | Cok | 313/512 |

(Continued)

FOREIGN PATENT DOCUMENTS

JP          07-312288          11/1995

(Continued)

OTHER PUBLICATIONS

European Search Report dated Sep. 28, 2007 (Application No. EP 07 10 9485).

(Continued)

*Primary Examiner* — Joseph L Williams
*Assistant Examiner* — Brenitra M Lee
(74) *Attorney, Agent, or Firm* — Knobbe Martens Olson & Bear LLP (57) ABSTRACT

A backlight unit for a liquid crystal display device (LCD), and an LCD including the same are disclosed. One embodiment of the backlight unit includes an organic light emitting element in which the efficiency of light extraction is improved without decreasing productivity to achieve high brightness and a low consumption power. The backlight unit includes a substrate, an organic light emitting element formed on the substrate, and an encapsulating member attached to the substrate to enclose the organic light emitting element. The backlight unit further includes a scattering film on one of surfaces of the substrate, the organic light emitting element and the encapsulating member to prevent light emitting from the organic light emitting element from being totally reflected.

19 Claims, 5 Drawing Sheets

U.S. PATENT DOCUMENTS

2007/0200492 A1* 8/2007 Cok et al. .............. 313/506
2007/0200496 A1* 8/2007 Cok et al. .............. 313/512

FOREIGN PATENT DOCUMENTS

| | | |
|---|---|---|
| JP | 10-189237 | 7/1998 |
| JP | 2001-290146 A | 10/2001 |
| JP | 2003-109747 | 4/2003 |
| JP | 2003-195303 | 7/2003 |
| JP | 2005-038767 | 2/2005 |
| JP | 2005-158665 | 6/2005 |
| JP | 3122548 | 5/2006 |
| KR | 1020040096186 A | 11/2004 |
| KR | 1020050110791 A | 11/2005 |
| WO | WO 98/17083 | 4/1998 |
| WO | WO 02/37580 A1 | 5/2002 |

OTHER PUBLICATIONS

Japan Office Action 2007 014348.

Chinese Office Action issued Jan. 8, 2010 in corresponding Application No. 2007101032014.

Korean Registration Determination Certificate of Patent for Invention Cert. No. 9-5-2007-036751735; issued Jun. 30, 2007.

* cited by examiner

BACKLIGHT UNIT AND LIQUID CRYSTAL DISPLAY DEVICE INCLUDING THE SAME

CROSS-REFERENCE TO RELATED APPLICATION

This application claims the benefit of Korean Patent Application No. 10-2006-0050472, filed on Jun. 5, 2006, in the Korean Intellectual Property Office, the disclosure of which is incorporated herein in its entirety by reference.

BACKGROUND

1. Field

The instant disclosure relates to a backlight unit and a liquid crystal display (LCD) device including the same, and more particularly, to a backlight unit using an organic light emitting element, and an LCD including the backlight unit.

2. Description of the Related Technology

Recently, organic light emitting elements or diodes have been widely used as backlight units of liquid crystal display (LCD) devices. When an organic light emitting element is used as the backlight of an LCD, the power consumption of the organic light emitting element is greater than that of a fluorescent lamp. In addition, the brightness of the organic light emitting element is lower than that of a fluorescent lamp. Accordingly, in order to use the organic light emitting element as the backlight unit of the LCD, there is a need to reduce the power consumption of the organic light emitting element and to increase the brightness of the organic light emitting element.

Generally, in order to improve the brightness of organic light emitting elements, a light resonance structure is widely used. The light resonance structure can be constructed by finely adjusting an inner distance of the organic light emitting element, that is, a distance between a reflective layer and a semi-transparent/reflective layer in each layer of the organic light emitting element.

For the inner distance of the light resonance structure to be finely adjusted, a high-precision process is required since each layer of the organic light emitting element has a thickness in the order of angstroms to micrometers. Accordingly, the manufacturing yields may decrease. In addition, the manufacturing costs may increase to obtain the desired light resonance.

SUMMARY

One embodiment provides a backlight unit using an organic light emitting element in which the efficiency of light extraction is improved without decreasing productivity to achieve high brightness and a low consumption power, and a liquid crystal display (LCD) device including the backlight unit.

Another embodiment provides a backlight unit device for use with a display device, comprising: a substrate; an encapsulating member substantially opposing the substrate, the encapsulating member being substantially transparent, the encapsulating member having a first refractive index, the encapsulating member having an outer surface facing away from the substrate; an organic light emitting element interposed between the substrate and encapsulating member; a seal surrounding the organic light emitting element while interconnecting the first substrate and the encapsulating member; and a scattering film interposed between the organic light emitting element and the encapsulating member, or formed over the outer surface of the encapsulating member, wherein the scattering film has a second refractive index different from the first refractive index.

The substrate may have an inner surface facing the encapsulating member, and the organic light emitting element may be formed on the inner surface of the substrate. The encapsulating member may have an inner surface facing the substrate, and the scattering film may be formed on at least one of the inner and outer surfaces of the encapsulating member. The organic light emitting element may have a surface facing the encapsulating member, and the scattering film may be formed on the surface of the organic light emitting element.

The encapsulating member may have an inner surface facing the substrate, wherein the organic light emitting element is formed on the inner surface of the encapsulating member, and wherein the scattering film is formed on the outer surface of the encapsulating member. The encapsulating member may have an inner surface facing the substrate, wherein the scattering film is formed on the inner surface of the encapsulating member, and wherein the organic light emitting element is formed on the scattering film while facing the substrate.

The scattering film may further comprise a plurality of particles dispersed therein. The plurality of particles may have a third refractive index different from the second refractive index. The device may further comprise a discontinuous layer formed on the scattering film, the layer being formed of a material having a refractive index different from the second refractive index. The scattering film may have a discontinuous pattern.

The device may further comprise a substantially transparent adhesive layer interposed between the scattering film and a surface on which the film is formed. The scattering film may be configured to substantially prevent total reflection of light emitting from the organic light emitting element. A more amount of light may emit out of the encapsulating member relative to an amount of light emitting out of the encapsulating member in the absence of a scattering film. The second refractive index may be about 1.2 to about 1.8. The first refractive index may be greater than the second refractive index.

The device may further comprise a protective layer formed on a surface of the organic light emitting element, the surface facing the encapsulating member, and the scattering film may be formed on the protective layer. The device may further comprise a protective layer formed over a surface of the organic light emitting element, the surface facing the encapsulating member, wherein the scattering film is interposed between the protective layer and the organic light emitting element.

Another embodiment provides a display device comprising the backlight unit device described above. The display device may be a liquid crystal display (LCD) device. The display device may further comprise a liquid crystal display (LCD) panel having a surface, wherein the backlight unit opposes the surface of the LCD panel such that the encapsulating member faces the surface of the LCD panel.

Another embodiment provides a backlight unit comprising: a substrate; an organic light emitting element formed on the substrate and emitting white light; an encapsulating member attached to the substrate to seal the organic light emitting element; and a scattering film formed on a side at which light emitted by the organic light emitting element is extracted, and formed on one surface of surfaces of the substrate, the organic light emitting element and the encapsulating member.

Light may be extracted through the substrate. The scattering film may be formed on an opposite surface of a surface of the substrate on which the organic light emitting element is formed. The scattering film may be interposed between the substrate and the organic light emitting element. Light may be extracted through the encapsulating member. The scattering film may be formed between the organic light emitting element and the encapsulating member. The scattering film may be formed on a surface of the encapsulating member which faces the organic light emitting element.

The backlight unit may further comprise a protective layer formed on the organic light emitting element, wherein the scattering film is formed on the protective layer. The backlight unit may further comprise a protective layer formed on the organic light emitting element, wherein the scattering film is interposed between the protective layer and the organic light emitting element.

The scattering film may be formed on an outer surface of the encapsulating member. The organic light emitting element may comprise a plurality of pixels. The organic light emitting element may be a flat luminescence type organic light emitting element. The organic light emitting element may comprise a single emissive layer emitting white light. The organic light emitting element may comprise at least two emissive layers for emitting white light.

Yet another embodiment provides a liquid crystal display (LCD) device including: a liquid crystal display panel; and a backlight unit formed on one side of the liquid crystal display panel, wherein the backlight unit comprises: a substrate; an organic light emitting element formed on the substrate and emitting white light; an encapsulating member attached to the substrate to seal the organic light emitting element; and a scattering film formed on a surface through which light emitted from the organic light emitting element is extracted, the surface being one of surfaces of the substrate, the organic light emitting element, and the encapsulating member.

Light emitted from the organic light emitting element may be emitted towards the substrate. The scattering film of the backlight unit may be formed on an opposite surface of a surface of the substrate on which the organic light emitting element is formed. The scattering film of the backlight unit may be interposed between the substrate and the organic light emitting element.

Light emitted from the organic light emitting element may be emitted towards the encapsulating member. The scattering film of the backlight unit may be interposed between the organic light emitting element and the encapsulating member. The scattering film of the backlight unit may be formed on an inner surface of the encapsulating member which faces the organic light emitting element.

The LCD device may further comprise a protective layer formed on the organic light emitting element, wherein the scattering film is formed on the protective layer. The LCD device may further comprise a protective layer formed on the organic light emitting element, wherein the scattering film is interposed between the protective layer and the organic light emitting element.

The scattering film may be formed on an outer surface of the encapsulating member. The organic light emitting element may comprise a plurality of pixels. The organic light emitting element may be a flat luminescence type organic light emitting element. The organic light emitting element may comprise a single emissive layer emitting white light. The organic light emitting element may comprise at least two emissive layers stacked to emit white light.

BRIEF DESCRIPTION OF THE DRAWINGS

The above and other aspects of the instant disclosure will become more apparent by describing in detail exemplary embodiments thereof with reference to the attached drawings in which.

DETAILED DESCRIPTION

The instant disclosure will now be described more fully with reference to the accompanying drawings, in which exemplary embodiments are shown. The instant disclosure may, however, be embodied in many different forms and should not be construed as being limited to the embodiments set forth herein.

Figure 1:
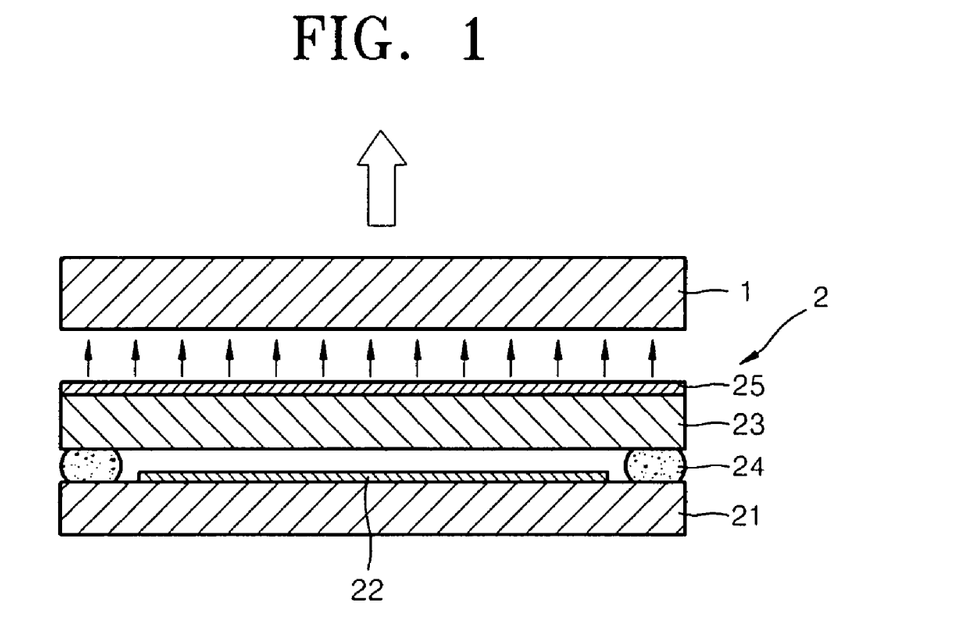
FIG. 1 is a schematic cross-sectional view of a liquid crystal display (LCD) device using a top emission type organic light emitting device as a backlight unit, according to an embodiment.

FIG. 1 is a schematic cross-sectional view of a liquid crystal display (LCD) device according to an embodiment. Referring to FIG. 1, the LCD includes a liquid crystal display panel 1 and a backlight unit 2 formed on one side of the liquid crystal display panel 1. The liquid crystal display panel 1 may be any kind of LCD panel such as a thin film transistor (TFT) LCD, Super-Twisted Nematic (STN) LCD, or the like. It may be a mono color LCD or a full color LCD. The liquid crystal display panel 1 may include color filters and a plurality of pixels. The liquid crystal display panel 1 may include at least one polarizer. Although not illustrated, the LCD may include at least one condenser such as a prism sheet formed between the liquid crystal display panel 1 and the backlight unit 2.

The backlight unit 2 includes an organic light emitting element. The backlight unit 2 includes a substrate 21, and an organic emissive part 22 formed on the substrate 21. The organic emissive part 22 includes an organic light emitting element. The backlight unit 2 also includes an encapsulating member 23 opposing the substrate 21. A sealing adhesive 24 is interposed between the substrate 21 and the encapsulating member 23 while interconnecting them. The substrate 21, the encapsulating member 23, and the adhesive together define an enclosed space in which the organic emissive part 22 is positioned. The adhesive 24 may provide the space with hermetic sealing. Referring to FIG. 1, the encapsulating member 23 may be formed of light transmitting glass or plastic material. The sealing adhesive 24 may be formed of any suitable sealant. An exemplary sealant is frit. The substrate 21 may be a glass substrate formed of $SiO_2$, but is not limited thereto. That is, the substrate 21 may be formed of plastic, metal, or the like.

The backlight unit 2 may be a top emission type organic light emitting device in which light emits through the encapsulating member 23. In certain embodiments, the organic emissive part 22 illustrated in FIG. 1 may include an organic light emitting element configured to emit white light.

The illustrated backlight unit 2 further includes a scattering film 25 formed on the encapsulating member 23 through which light emits. The scattering film 25 prevents light emitting through the encapsulating member 23 from being totally reflected on the external surface of the encapsulating member 23. That is, when light generated from the backlight unit 2 emits through the encapsulating member 23, total reflection may occur on the external surface of the encapsulating member 23 due to a difference between the refractive indices of the encapsulating member 23 and air. The term "total reflection," as used herein, refers to an optical phenomenon that occurs when light strikes a medium boundary at a steep angle. If the refractive index is lower on the other side of the boundary, no light can pass through, so effectively all of the light is reflected.

Figure 2:
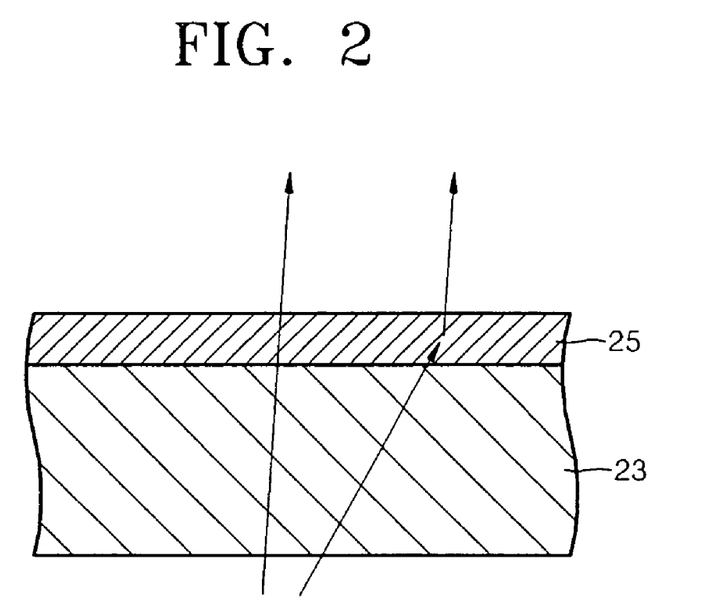
FIG. 2 is a schematic partial cross-sectional view illustrating an embodiment where light emits through the encapsulating member and the scattering film of FIG. 1.

The scattering film 25 formed on the encapsulating member 23 allows light, which would otherwise be totally reflected on an interface between the encapsulating member 23 and air, to emit toward the LCD panel 1. As illustrated in FIG. 2, the scattering film 25 prevents light emitting through the encapsulating member 23 from being totally reflected, and allows the light to be transmitted out of the backlight unit 2. In one embodiment, the scattering film 25 may have a refractive index of about 1.2 to about 1.8. Accordingly, the efficiency of light emission can remarkably improve. In addition, a high brightness and a low consumption of electric power can be achieved. The scattering film 25 may be formed of any suitable material which can prevent reflection of light.

Figure 3:
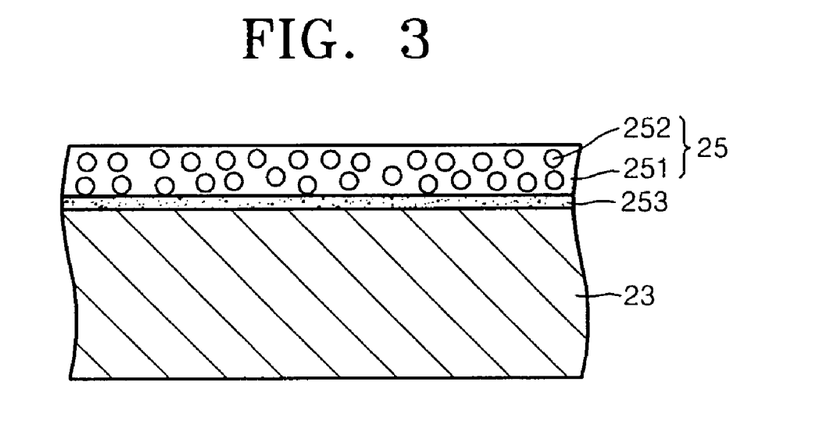
FIG. 3 is a schematic partial cross-sectional view illustrating a scattering film, according to an embodiment.

FIG. 3 is a cross-sectional view illustrating a scattering film 25, according to an embodiment. Referring to FIG. 3, the scattering film 25 may form a separate sheet which can be attached to an encapsulating member 23 by a transparent adhesive layer 253. The scattering film 25 may include a transparent resin layer 251 and a plurality of scattering particles 252 dispersed in the transparent resin layer 251.

The transparent resin layer 251 may be formed of materials selected from the group consisting of styrene resins, acrylic resins, vinyl ester resins, vinyl ether resins, halogen-containing resins, olefin resins, polyphenylene ether resins, polyphenylene sulfide resins, cellulose derivatives, silicon resins, rubbers, elastomers, combinations thereof, or the like.

The particles 252 may be formed of a light-reflective metal. Examples of such a metal include aluminum, silver, and gold, but are not limited thereto. That is, the particle 252 may be formed of any material having a refractive index different from that of the transparent resin layer 251. In one embodiment, the refractive index of the particles 252 may be greater than that of the transparent resin layer 251. In another embodiment, the refractive index of the particles 252 may be smaller than that of the transparent resin layer 251.

In the scattering film 25, the amount of light emitting in a direction substantially perpendicular to the top surface of the scattering film 25 may be greater than the amount of light emitting in a direction at an angle to the surface of the scattering film 25. Accordingly, the amount of light reaching the liquid crystal display panel 1 can be greatly increased.

Figure 4:
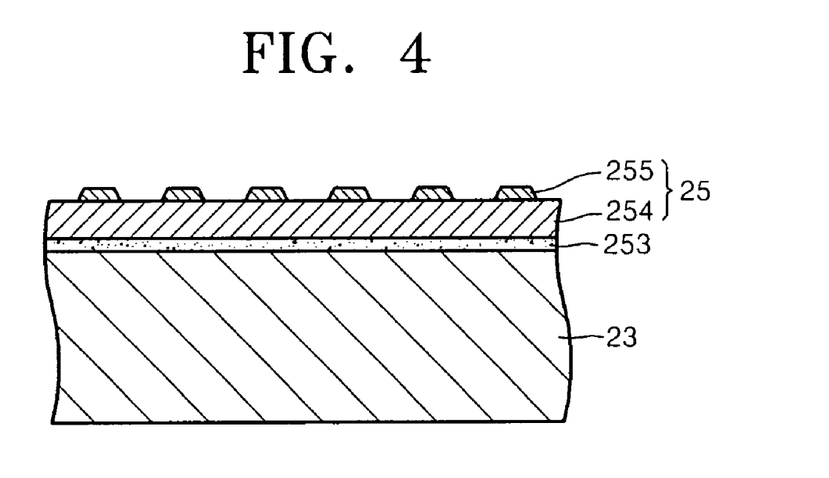
FIG. 4 is a schematic partial cross-sectional view illustrating a scattering film, according to another embodiment.

FIG. 4 is a cross-sectional view illustrating a scattering film 25, according to another embodiment. Referring to FIG. 4, the scattering film 25 may form a separate sheet which can be attached to an encapsulating member 23 by a transparent adhesive layer 253. The scattering film 25 may include a transparent base film 254 and a plurality of light diffusing patterns 255 printed or coated thereon.

The transparent base film 254 may be formed of transparent resin materials selected from the group consisting of styrene resins, acrylic resins, vinyl ester resins, vinyl ether resins, halogen-containing resins, olefin resins, polyphenylene ether resins, polyphenylene sulfide resins, cellulose derivatives, silicon resins, rubbers, elastomers, combinations thereof, or the like.

The light diffusing patterns 255 are formed by printing white pigments on the transparent base film 254, or alternatively, by coating a light reflective metal such as aluminum, silver, gold, or the like in a predetermined pattern.

Figure 5:
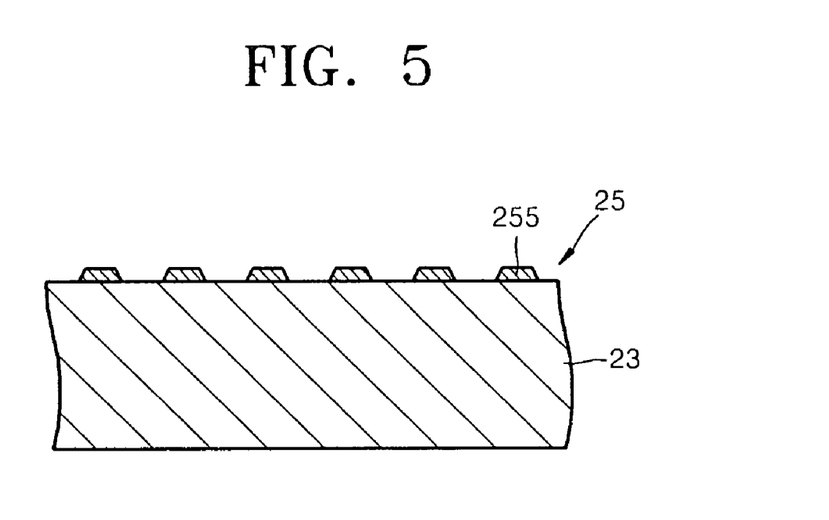
FIG. 5 is a schematic partial cross-sectional view illustrating a scattering film, according to another embodiment.

FIG. 5 is a cross-sectional view illustrating a scattering film 25, according to another embodiment. Referring to FIG. 5, the scattering film 25 is formed by painting or coating a plurality of light diffusing patterns 255 directly on an encapsulating member 23.

Referring to FIGS. 4 and 5, the scattering film 25 having the light diffusing pattern 255 prevents light emitting through the encapsulating member 23 at an angle to the top surface of the encapsulating member 23, from being totally reflected, thereby greatly improving the brightness.

Figure 6:
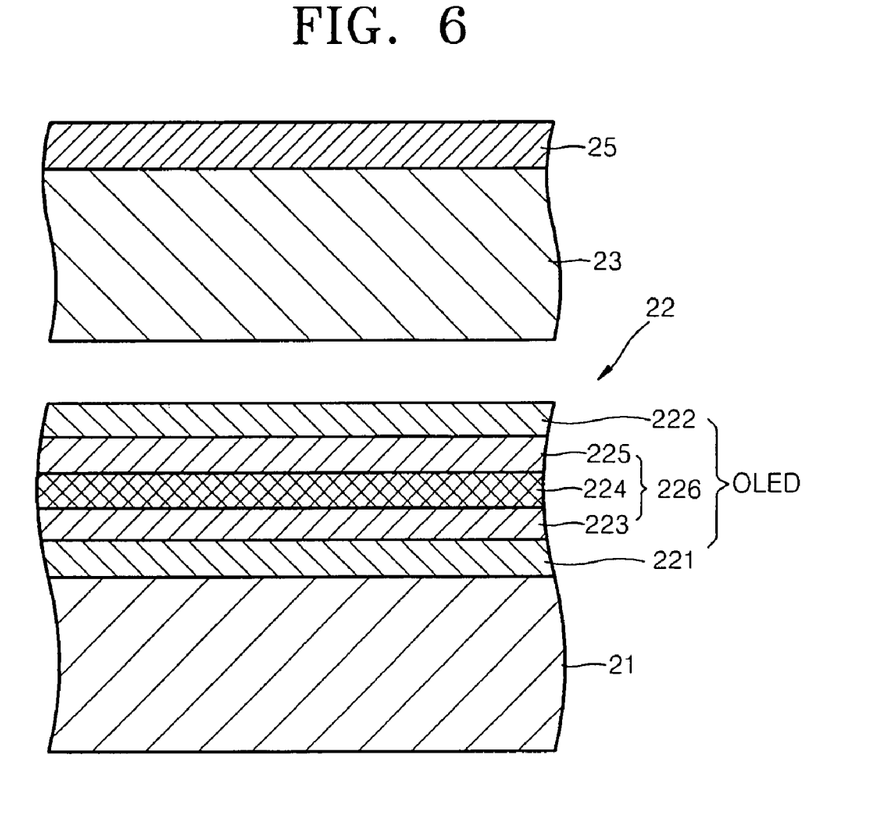
FIG. 6 is a schematic partial cross-sectional view illustrating the organic emissive part of FIG. 1.

FIG. 6 is a cross-sectional view illustrating the organic emissive part 22 of FIG. 1. Referring to FIG. 6, the organic emissive part 22 includes an organic light emitting element including a substrate 21, a first electrode 221 formed on the substrate 21, a second electrode 222 opposing the first electrode 221, and organic layers 226 interposed between the first electrode 221 and the second electrode 222. The first electrode 221 and the second electrode 222 may function as anode and cathode electrodes, respectively, or vice versa.

When the first electrode 221 functions as the anode electrode, it can include a conductor having a high work function. When the first electrode 221 functions as the cathode electrode, it can include a conductor having a low work function. When the second electrode 222 functions as the cathode electrode, it can include a conductor having a low work function. When the second electrode 222 functions as the anode electrode, it can include a conductor having a high work function. The conductor having a high work function may be formed of transparent conductive oxides such as ITO, $In_2O_3$, ZnO, IZO, or the like, and noble metals such as Au, or the like. The conductor having a low work function may be formed of Ag, Al, Mg, Li, Ca, LiF/Ca, LiF/Al, or the like.

In the top emission type organic light emitting device as illustrated in FIGS. 1 and 6, the first electrode 221 can include a light reflector. The second electrode 222 may be a light transmitting type electrode.

When the first electrode 221 functions as the anode electrode, the light reflector can be formed of at least on selected from the group of Ag, Mg, Al, Pt, Pd, Au, Ni, Nd, Ir, Cr, and compounds thereof. The reflector may further include another layer formed of a conductive material, such as ITO, IZO, ZnO, $In_2O_3$, or a mixture of two or more of the foregoing. When the first electrode 221 functions as the cathode electrode, it can be formed of Ag, Al, Mg, Li, Ca, LiF/Ca, LiF/Al, or the like which has a low work function and a high reflectivity to light.

When the second electrode 222 functions as the cathode electrode, it can be a thin metal layer partially transmitting light. The second electrode 222 can be formed of a metal, such as Li, Ca, LiF/Ca, LiF/Al, Al, Mg, Ag, or the like which has a low work function. The second electrode 222 may further include a transparent conductor such as ITO, IZO, ZnO, or $In_2O_3$ formed on the thin metal layer, thereby enhancing the conductivity of the electrode 222. When the second electrode 222 functions as the anode electrode, it can be formed of ITO, IZO, ZnO, $In_2O_3$, or a mixture of two or more of the foregoing.

Organic layers 226 facilitate the flow of holes and electrons generated from the anode and cathode electrodes. When the first electrode 221 functions the anode electrode, the first organic layer 223 can be a hole injection/transport layer. The second organic layer 225 can be an electron injection/transport layer. When the first electrode 221 functions the cathode electrode, the first organic layer 223 can be an electron/injection/transport layer, and the second organic layer 225 can be a hole injection/transport layer.

The organic layer 224 may be formed of a single white light emitting organic compound, or alternatively, it may be formed by stacking at least two organic emissive layers having a different color from each other to achieve white light emission.

When the organic layer 224 is formed by stacking at least two organic emissive layers, a red emissive layer, a green emissive layer, and a blue emissive layer can be stacked sequentially to form the emissive layer 224, or alternatively, a sky blue layer may be formed on a red-green mixed layer to form the emissive layer 224. In addition, the white light emission can be achieved using various methods.

The organic light emitting element may be a device of a passive matrix (PX) type or an active matrix (AM) type. The PX and AM type devices can have any conventional structure. The organic light emitting element may include a plurality of pixels, but the structure of the organic light emitting element is not limited thereto. In some embodiments, the organic light emitting element may be a flat emitting type organic light emitting element having a single pixel.

When the organic emissive part has a plurality of pixels, each pixel of the organic emissive part is arranged to correspond to a pixel of the liquid crystal display panel 1.

Figure 7:
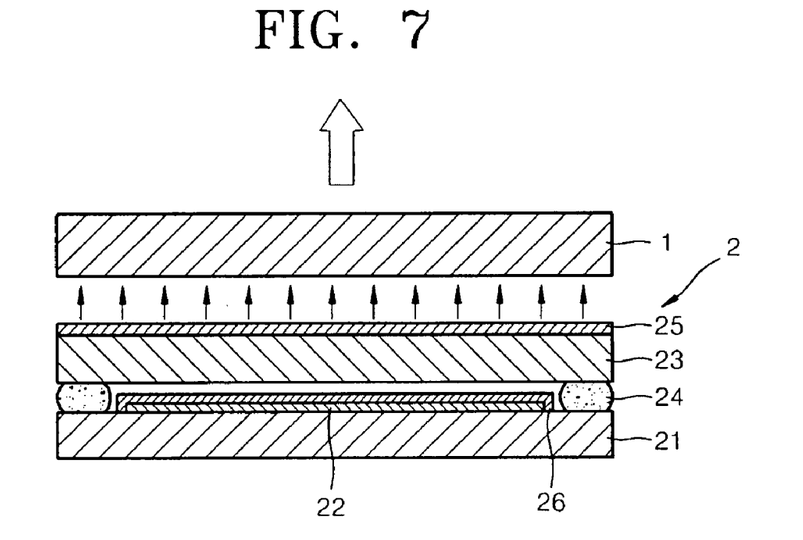
FIG. 7 is a schematic cross-sectional view of an LCD device using a top emission type organic light emitting device as a backlight unit, according to another embodiment.

In one embodiment, as illustrated in FIG. 7, the organic emissive part 22 including the organic light emitting element may be covered with a protective layer 26. The protective layer 26 is formed on the organic emissive part 22. The protective layer 26 protects the organic emissive part 22 including the organic light emitting element from oxygen and moisture. The protective layer 26 may be formed of transparent inorganic and/or organic compounds.

The inorganic compounds may be metal oxide, metal nitride, metal carbide, metal oxynitride or compounds thereof. Metal oxide may be silicon oxide, aluminum oxide, titanium oxide, indium oxide, tin oxide, indium tin oxide or compounds thereof. Metal nitride may be aluminum nitride, silicon nitride or compounds thereof. Metal carbide may be silicon carbide. Metal oxynitride may be silicon oxynitride. In addition, inorganic compounds may be silicon, ceramic derivatives of silicon or metal, or diamond-like carbon (DLC).

Organic compounds may be organic polymers (e.g., acryl resins), inorganic polymers, organometallic polymers, hybrid organic/inorganic polymers, or the like.

Figure 8:
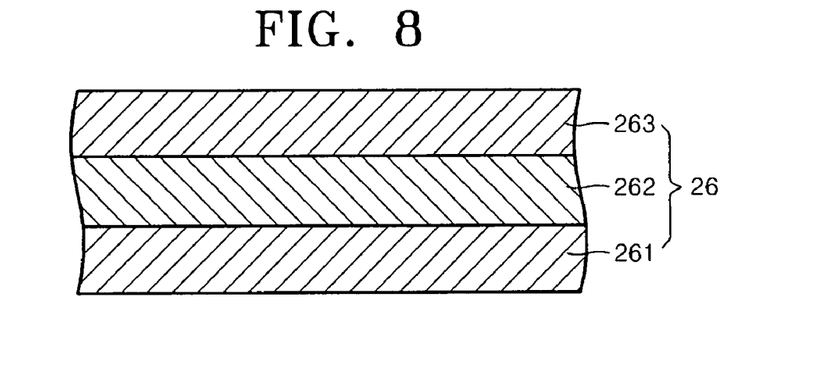
FIG. 8 is a schematic partial cross-sectional view of a protective layer, according to an embodiment.

As illustrated in FIG. 8, inorganic layers 261 and 263 and an organic layer 262 may be alternately stacked to form the protective layer 26. A stacking order of the inorganic layers 261 and 263 and the organic layer 262 is not limited to the structure of the protective layer 26 shown in FIG. 8. In one embodiment, an organic layer, an inorganic layer and an organic layer may be stacked sequentially. A stacking structure is not limited to a structure having three layers, as in the protective layer 26 shown in FIG. 8. In certain embodiments, the protective layer 26 may have more than three layers. The above described structures of the protective layer 26 can be used in all the embodiments described above.

As illustrated in FIGS. 1 and 7, a space is formed between the organic emissive part 22 and the encapsulating member 23. However, a structure of the backlight unit 2 is not limited to those of FIGS. 1 and 7. That is, resins such as acryl, inert gases, or the like may fill the space formed between the organic emissive part 22 and the encapsulating member 23. A moisture absorbent may fill the space formed between the organic emissive part 22 and the encapsulating member 23. These configurations can be applied to all embodiments described above.

Figure 9:
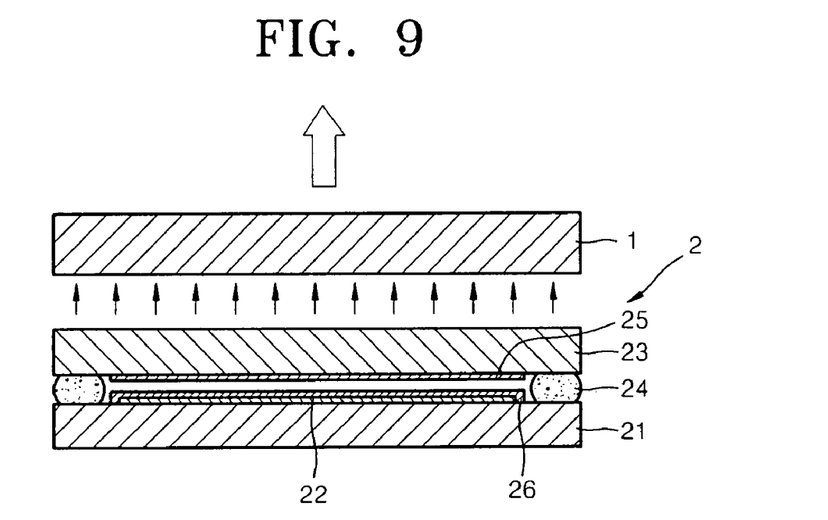
FIG. 9 is a schematic cross-sectional view of an LCD device using a top emission type organic light emitting device as a backlight unit, according to another embodiment.
Figure 10:
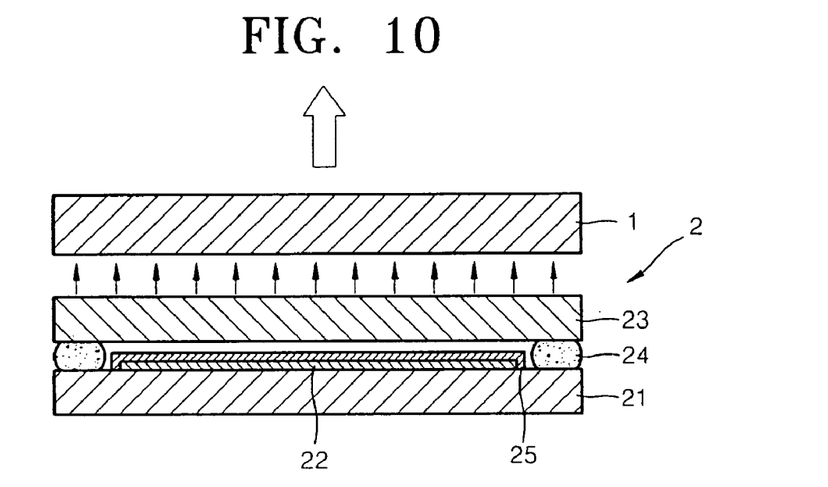
FIG. 10 is a schematic cross-sectional view of an LCD device using a top emission type organic light emitting device as a backlight unit, according to another embodiment.

FIG. 9 is a cross-sectional view of an LCD device using a top emission type organic light emitting device as a backlight unit, according to another embodiment. Referring to FIG. 9, in a backlight unit 2 including the top emission type organic light emitting device, a scattering film 25 is formed between an encapsulating member 23 and an organic emissive part 22. In particular, the scattering film 25 is formed on an inner surface, that is, it is formed on a surface of the encapsulating member 23 which faces the organic emissive part 22. In yet another embodiment, as illustrated in FIG. 10, the scattering film 25 may be formed to cover the organic emissive part 22.

Figure 11:
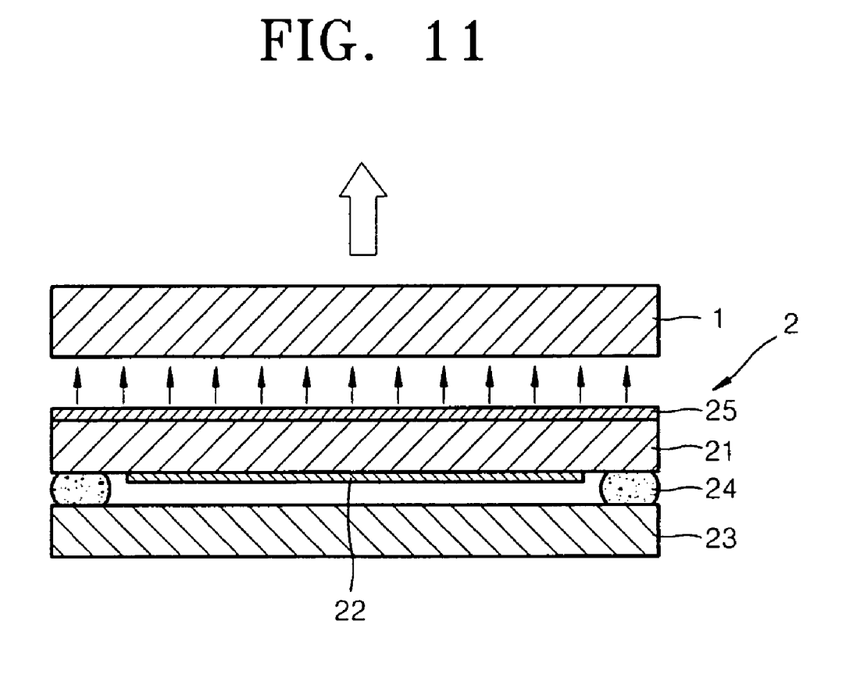
FIG. 11 is a schematic cross-sectional view of an LCD device using a bottom emission type organic light emitting device as a backlight unit, according to an embodiment.
Figure 12:
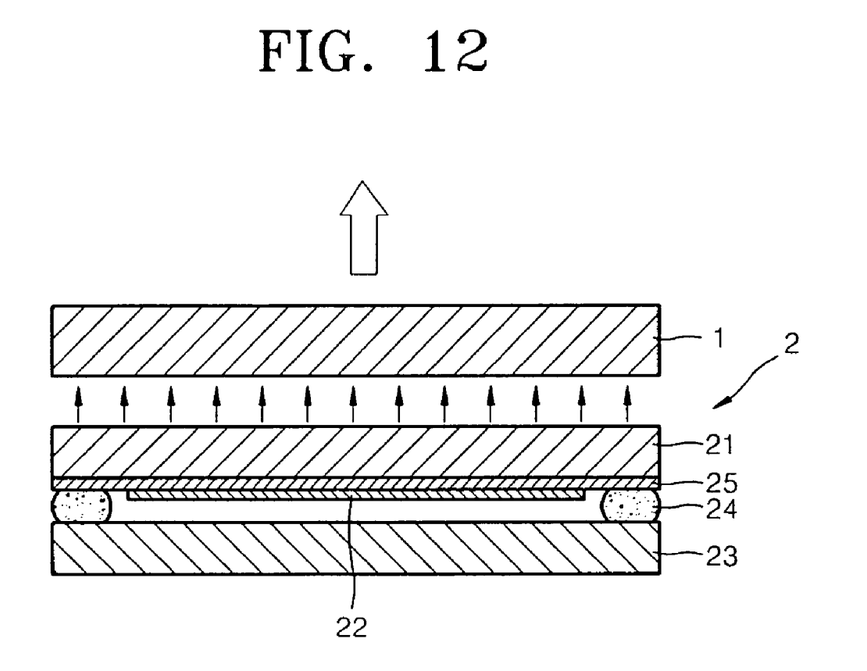
FIG. 12 is a schematic cross-sectional view of an LCD device using a bottom emission type organic light emitting device as a backlight unit, according to another embodiment.

FIGS. 11 and 12 are cross-sectional views illustrating LCD devices, in which a bottom emission type organic light emitting device is used as a backlight unit 2. In such devices, light emits through the substrate 21, In FIG. 11, a scattering film 25 is formed on an outer surface of a substrate 21, that is, it is formed on a surface of the substrate 21 facing a liquid crystal display panel 1. In FIG. 12, a scattering film 25 is formed on an inner surface of a substrate 21, that is, it is formed between the substrate 21 and an organic emissive part 22.

The configurations described above can achieve the following. First, a scattering film prevents a total reflection of light output incident at an angle to the surface of the scattering film, and thus improves brightness. Second, a backlight unit having high brightness can be provided. Third, an organic light emitting device having a low consumption of electric power can be used as a backlight unit.

While the instant disclosure has been particularly shown and described with reference to exemplary embodiments thereof, it will be understood by those of ordinary skill in the art that various changes in form and details may be made therein without departing from the spirit and scope of the instant disclosure as defined by the following claims.

What is claimed is:

1. A backlight unit device for use with a display device, comprising:
   a substrate;
   an encapsulating member substantially opposing the substrate, the encapsulating member being substantially transparent, the encapsulating member having a first refractive index, the encapsulating member having an outer surface facing away from the substrate;
   an organic light emitting element interposed between the first substrate and the encapsulating member; and
   a scattering film formed on and contacting the outer surface of the encapsulating member, wherein the scattering film comprises a transparent base film and a plurality of light diffusing units which are arranged on the surface of the transparent base film and being arranged to form a regular pattern.

2. The device of claim 1, wherein the substrate has an inner surface facing the encapsulating member, and wherein the organic light emitting element is formed on the inner surface of the substrate.

3. The device of claim 2, wherein the encapsulating member comprises an inner surface facing the substrate and an outer surface facing away from the substrate, and wherein the scattering film is formed on at least one of the inner and outer surfaces of the encapsulating member.

4. The device of claim 2, wherein the organic light emitting element has a surface facing the encapsulating member, and wherein the scattering film is formed on the surface of the organic light emitting element.

5. The device of claim 1, wherein the encapsulating member has an inner surface facing the substrate, wherein the scattering film is formed on the inner surface of the encapsulating member, and wherein the organic light emitting element is formed on the scattering film while facing the substrate.

6. The device of claim 1, wherein the scattering film has a discontinuous pattern.

7. The device of claim 1, further comprising a substantially transparent adhesive layer interposed between the scattering film and a surface on which the film is formed.

8. The device of claim 1, wherein the scattering film is configured to substantially prevent total reflection of light emitting from the organic light emitting element.

9. The device of claim 1, wherein a more amount of light emits out of the encapsulating member relative to an amount of light emitting out of the encapsulating member in the absence of a scattering film.

10. The device of claim 1, further comprising a protective layer formed on a surface of the organic light emitting element, the surface facing the encapsulating member, and wherein the scattering film is formed on the protective layer.

11. The device of claim 1, further comprising a protective layer formed over a surface of the organic light emitting element, the surface facing the encapsulating member, wherein the scattering film is interposed between the protective layer and the organic light emitting element.

12. A display device comprising the backlight unit device of claim 1.

13. The display device of claim 12, wherein the display device is a liquid crystal display (LCD) device.

14. The display device of claim 13, further comprising a liquid crystal display (LCD) panel having a surface, wherein the backlight unit device opposes the surface of the LCD panel such that the encapsulating member faces the surface of the LCD panel.

15. The display device of claim 1, wherein the scattering film is interposed between the organic light emitting element and the encapsulating member.

16. The display device of claim 1, wherein the scattering film comprises a coating of light diffusing patterns directly on the encapsulating member.

17. The device of claim 1, wherein the transparent base film is formed of a material selected from the group consisting of styrene resins, acrylic resins, vinyl ester resins, vinyl ether resins, halogen containing resins, olefin resins, polyphenylene ether resins, polyphenylene sulfide resins, cellulose derivatives, silicon resins, rubbers, elastomers and combinations thereof and wherein the encapsulating member is formed of light transmitting glass or light transmitting plastic.

18. The device of claim 1, wherein the light diffusing units are formed of white pigments or the light diffusing units are formed of light reflective and light scattering metal particles selected from the group consisting of aluminum, silver and gold.

19. The device of claim 1, wherein the light diffusing units are separated from each other along an axis which is parallel to the top surface of the transparent base film.

* * * * *